(12) United States Patent
Lai et al.

(10) Patent No.: US 9,818,760 B1
(45) Date of Patent: Nov. 14, 2017

(54) MEMORY STRUCTURE, METHOD OF OPERATING THE SAME, AND METHOD OF MANUFACTURING THE SAME

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/463,109

(22) Filed: Mar. 20, 2017

(51) Int. Cl.
| | |
|---|---|
| G11C 5/02 | (2006.01) |
| H01L 27/11582 | (2017.01) |
| H01L 27/1157 | (2017.01) |
| G11C 16/04 | (2006.01) |
| G11C 16/08 | (2006.01) |

(52) U.S. Cl.
CPC .... *H01L 27/11582* (2013.01); *G11C 16/0466* (2013.01); *G11C 16/08* (2013.01); *H01L 27/1157* (2013.01)

(58) Field of Classification Search
CPC ........ G11C 5/02; G11C 16/0466; G11C 16/08
USPC ...................................... 365/51–62
See application file for complete search history.

(56) References Cited

U.S. PATENT DOCUMENTS

| | | |
|---|---|---|
| 9,379,122 B2 | 6/2016 | Shin et al. |
| 9,379,131 B2 | 6/2016 | Lai |
| 9,401,209 B2 | 7/2016 | Shim et al. |
| 9,401,371 B1 | 7/2016 | Lee et al. |
| 2016/0005746 A1* | 1/2016 | Lee ................... H01L 27/11573 365/185.18 |
| 2016/0163733 A1 | 6/2016 | Park et al. |
| 2016/0240551 A1 | 8/2016 | Lai |

FOREIGN PATENT DOCUMENTS

TW 201630114 A 8/2016

OTHER PUBLICATIONS

TIPO Office Action dated Aug. 30, 2017 in Taiwan application (No. 106110793).

* cited by examiner

*Primary Examiner* — Harry W Byrne
(74) *Attorney, Agent, or Firm* — McClure, Qualey & Rodack, LLP

(57) ABSTRACT

A memory structure includes stacks, memory layers, channel layers, dielectric layers, and first conductive lines. Each stack includes a group of alternating conductive strips and insulating strips. The memory layers are conformally disposed on the stacks. The channel layers are conformally disposed on the memory layers. The dielectric layers are disposed on portions of the channel layers at first sides of the stacks and portions of the channel layers at second sides of the stacks. The first conductive lines are disposed along sidewalls of the stacks. The first conductive lines are isolated from the channel layers by the dielectric layers. One first conductive line disposed at the first side of one stack is isolated from one first conductive line disposed at the second side of the same stack and isolated from one first conductive line disposed at the second side of an adjacent stack.

20 Claims, 27 Drawing Sheets

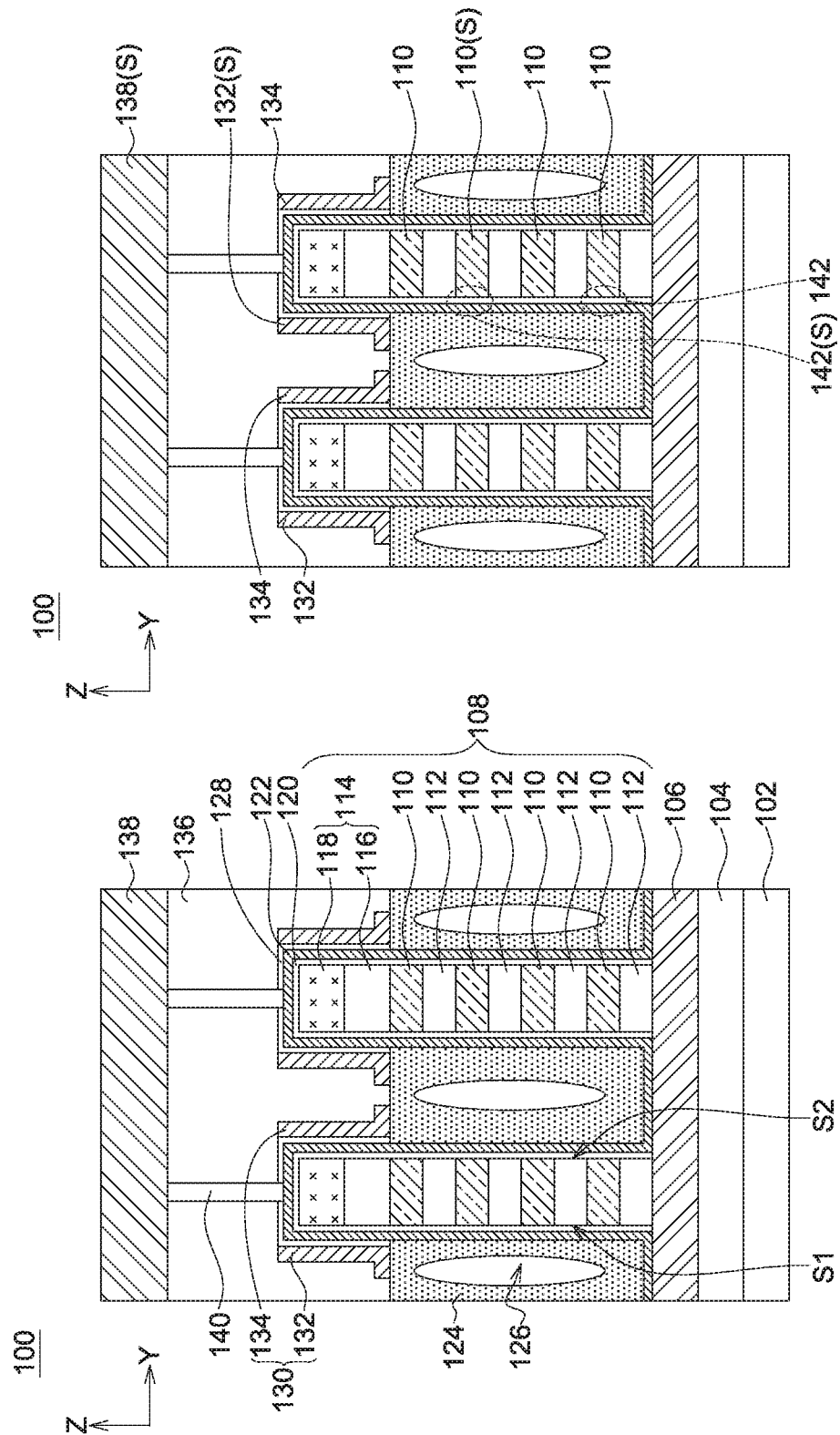

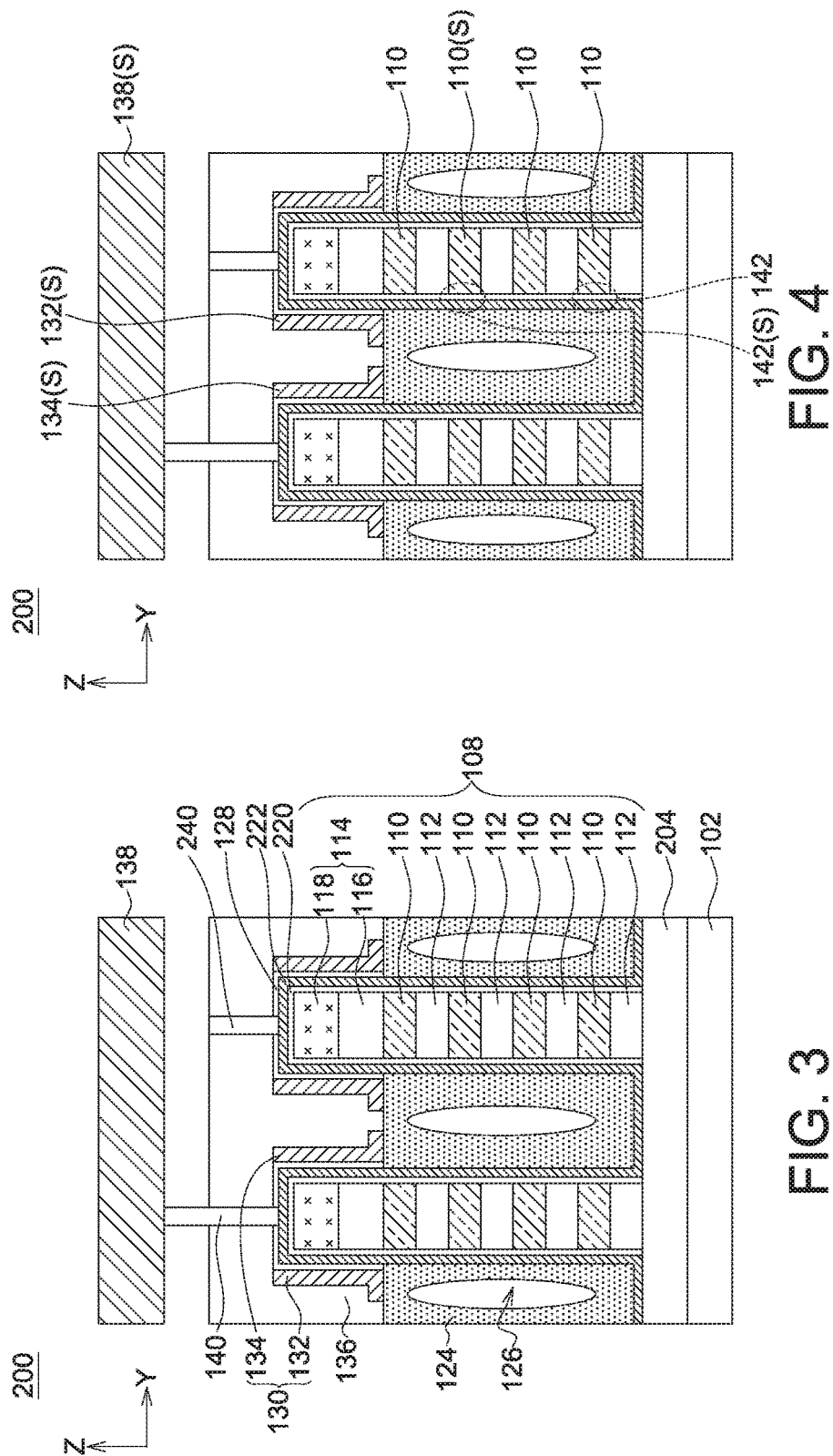

MEMORY STRUCTURE, METHOD OF OPERATING THE SAME, AND METHOD OF MANUFACTURING THE SAME

TECHNICAL FIELD

This disclosure relates to a semiconductor structure, a method of operating the same, and a method of manufacturing the same. More particularly, this disclosure relates to a memory structure, a method of operating the same, and a method of manufacturing the same.

BACKGROUND

For reasons of decreasing volume and weight, increasing power density, improving portability, and the like, researcher and engineers have made every effort to increasing the density of semiconductor devices. One approach is using a 3-D structure instead of a conventional 2-D structure. Another approach is decreasing sizes of elements and spaces in a device. Both approaches have their own technological bottlenecks to be resolved.

SUMMARY

This disclosure is directed to a memory structure and methods of operating and manufacturing the same, by which a memory device with physical two-bits memory structure can be provided.

According to some embodiments, a memory structure comprises a substrate, a plurality of stacks, a plurality of memory layers, a plurality of channel layers, a plurality of dielectric layers, and a plurality of first conductive lines. The stacks are disposed on the substrate. Each of the stacks has a first side and a second side. Each of the stacks comprises a group of alternating conductive strips and insulating strips. The memory layers are conformally disposed on the stacks. The channel layers are conformally disposed on the memory layers. The dielectric layers are disposed on at least portions of the channel layers at the first sides of the stacks and portions of the channel layers at the second sides of the stacks. The first conductive lines are disposed along sidewalls of the stacks. The first conductive lines are isolated from the channel layers by the dielectric layers. The first conductive lines comprise a first group of the first conductive lines disposed at the first sides of the stacks and a second group of the first conductive lines disposed at the second sides of the stacks, and one first conductive line of the first group disposed at the first side of one of the stacks is isolated from one first conductive line of the second group disposed at the second side of the same stack and isolated from one first conductive line of the second group disposed at the second side of an adjacent stack of the stacks.

According to some embodiments, a method of operating a memory structure, such as the memory structure described above, comprises selecting one memory cell by selecting corresponding one or two string select lines, corresponding one bit line, and corresponding one word line.

According to some embodiments, a method of manufacturing a memory structure comprises the following steps. A substrate is provided. A plurality of stacks are formed on the substrate. Each of the stacks has a first side and a second side. Each of the stacks comprises a group of alternating conductive strips and insulating strips. A plurality of memory layers are formed conformally on the stacks. A plurality of channel layers are formed conformally on the memory layers. A plurality of dielectric layers are formed on at least portions of the channel layers at the first sides of the stacks and portions of the channel layers at the second sides of the stacks. A plurality of first conductive lines are formed along sidewalls of the stacks. The first conductive lines are isolated from the channel layers by the dielectric layers. The first conductive lines comprise a first group of the first conductive lines formed at the first sides of the stacks and a second group of the first conductive lines formed at the second sides of the stacks, and one first conductive line of the first group formed at the first side of one of the stacks is isolated from one first conductive line of the second group formed at the second side of the same stack and isolated from one first conductive line of the second group formed at the second side of an adjacent stack of the stacks.

BRIEF DESCRIPTION OF THE DRAWINGS

FIG. 1 illustrates a memory structure according to embodiments.

FIG. 2 illustrates a method of operating the memory structure.

FIG. 3 illustrates another memory structure according to embodiments.

FIG. 4 illustrates a method of operating the another memory structure.

Figure 5A:
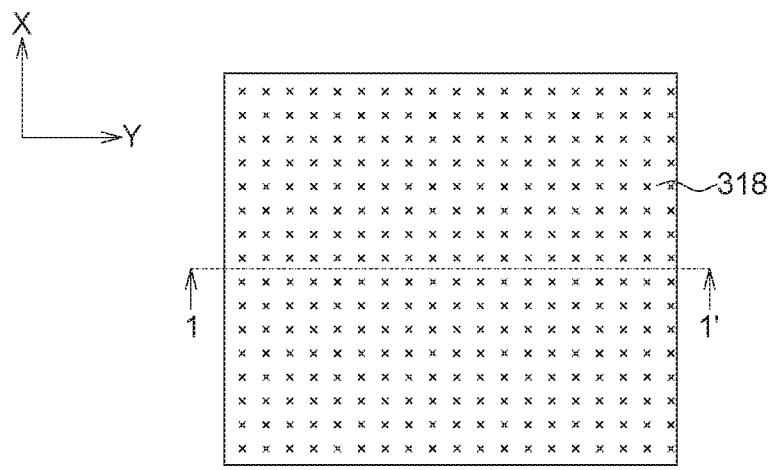
FIGS. 5A-19C illustrate a method of manufacturing a memory structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The accompanying drawings are provided for illustrative purpose rather than limiting purpose. For clarity, some elements may be exaggerated in some figures. For example, in a set of figures, an element may be exaggerated in only one figure. In addition, some components and/or reference numerals may be omitted from the drawings. It is contemplated that elements and features of one embodiment can be beneficially incorporated in another embodiment without further recitation.

A memory structure according to embodiments comprises a substrate, a plurality of stacks, a plurality of memory layers, a plurality of channel layers, a plurality of dielectric layers, and a plurality of first conductive lines. The stacks are disposed on the substrate. Each of the stacks has a first side and a second side. Each of the stacks comprises a group of alternating conductive strips and insulating strips. The memory layers are conformally disposed on the stacks. The channel layers are conformally disposed on the memory layers. The dielectric layers are disposed on at least portions of the channel layers at the first sides of the stacks and portions of the channel layers at the second sides of the stacks. The first conductive lines are disposed along sidewalls of the stacks. The first conductive lines are isolated from the channel layers by the dielectric layers. The first conductive lines comprise a first group of the first conductive lines disposed at the first sides of the stacks and a second group of the first conductive lines disposed at the second sides of the stacks, and one first conductive line of the first group disposed at the first side of one of the stacks is isolated from one first conductive line of the second group disposed at the second side of the same stack and isolated from one first conductive line of the second group disposed at the second side of an adjacent stack of the stacks.

Referring to FIG. 1, a memory structure 100 according to embodiments is shown. The memory structure 100 is shown as a 3-D vertical channel NAND memory structure with memory cells arranged in I-type strings.

The memory structure 100 comprises a substrate 102. The substrate 102 may comprise structures, components, and the like formed therein and/or thereon. The memory structure 100 may optionally comprise a buried layer 104 disposed on the substrate 102. For example, in some embodiments in which the substrate 102 provides a hole erase function, the memory structure 100 may comprise a thinner buried layer 104 or even without a buried layer. The memory structure 100 may comprise a source line 106 disposed on the buried layer 104. In some embodiments, the source line 106 provides a band-to-band hot hole erase function.

The memory structure 100 comprises a plurality of stacks 108 disposed on the substrate 102. As shown in FIG. 1, in a 3-D vertical channel NAND memory structure with memory cells arranged in I-type strings, the stacks 108 may be disposed on the source line 106. The stacks 108 and the components thereof (such as the conductive strips 110) extend in a first direction, such as a X-direction. Each stack 108 has a first side S1 and a second side S2. Each stack 108 comprises a group of alternating conductive strips 110 and insulating strips 112. Each stack 108 may further comprise an upper structure 114 disposed on the group of the conductive strips 110 and the insulating strips 112. According to some embodiments, the upper structure 114 may comprise a first insulating layer 116 and a second insulating layer 118. The first insulating layer 116 is disposed on the group of the conductive strips 110 and the insulating strips 112. The second insulating layer 118 is disposed on the first insulating layer 116.

The memory structure 100 comprises a plurality of memory layers 120 conformally disposed on the stacks 108. According to some embodiments, a memory layer 120 may have a blocking layer-trapping layer-tunneling layer structure, wherein the blocking layer is disposed closest to the stack 108, and the tunneling layer is disposed farthest away from the stack 108. The memory structure 100 comprises a plurality of channel layers 122 conformally disposed on the memory layers 120. Along the X-direction, more than one of the channel layers 122 may be disposed on each stack 108. In a Y-direction, the channel layers 122 disposed on adjacent stacks 108 may be connected to each other, as shown in FIG. 1.

The memory structure 100 may comprise an insulating material 124 disposed between the stacks 108 corresponding to the groups of the conductive strips 110 and the insulating strips 112. In some embodiments, air gaps 126 exist in the insulating material 124. The air gaps 126 are beneficial for decreasing the coupling rate of two adjacent channel layers 122.

The memory structure 100 comprises a plurality of dielectric layers 128 disposed on at least portions of the channel layers 122 at the first sides S1 of the stacks 108 and portions of the channel layers 122 at the second sides S2 of the stacks 108. In the memory structure 100, as shown in FIG. 1, the portions of the channel layers 122 at the first sides S1 of the stacks 108 and the portions of the channel layers 122 at the second sides S2 of the stacks 108 correspond to the upper structures 114 of the stacks 108. In some embodiments, the dielectric layers 128 comprise an oxide material. In some embodiments, the dielectric layers 128 comprise a high-k dielectric material.

The memory structure 100 comprises a plurality of first conductive lines 130 disposed along sidewalls of the stacks 108. In other words, the first conductive lines 130 may substantially extend in the first direction (the X-direction). The first conductive lines 130 are isolated from the channel layers 122 by the dielectric layers 128. As shown in FIG. 1, the dielectric layers 128 and the first conductive lines 130 may be positioned above the insulating material 124. Since the insulating material 124 may be disposed corresponding to the groups of the conductive strips 110 and the insulating strips 112, the first conductive lines 130 may be disposed at a level higher than the groups of the conductive strips 110 and the insulating strips 112. The first conductive lines 130 comprise a first group of the first conductive lines (132) disposed at the first sides S1 of the stacks 108 and a second group of the first conductive lines (134) disposed at the second sides S2 of the stacks 108. In the embodiments described herein, one first conductive line 132 of the first group disposed at the first side S1 of one stack 108 is isolated from one first conductive line 134 of the second group disposed at the second side S2 of the same stack 108, and isolated from one first conductive line 134 of the second group disposed at the second side S2 of an adjacent stack 108. As shown in FIG. 1, the first conductive lines 130 may have L-shaped cross sections. In addition, the L-shaped cross sections of the first group of the first conductive lines (132) and the L-shaped cross sections of the second group of the first conductive lines (134) may be mirror symmetrically. In some embodiments, the first conductive lines 130 comprise a polysilicon-based material, such as a doped-polysilicon material. In some embodiments, the first conductive lines 130 comprise a metal material.

The memory structure 100 may comprise a plurality of second conductive lines 138 disposed over the first conductive lines 130. More specifically, the memory structure 100 may comprise an interlayer dielectric material 136 covering the elements described above. The interlayer dielectric material 136 forms a layer providing a flat top surface, and the second conductive lines 138 are disposed on the surface. The second conductive lines 138 extend in a second direction different from the first direction, such as the Y-direction. The memory structure 100 may comprise a plurality of contacts 140 connecting the second conductive lines 138 to the channel layers 122.

Referring to FIG. 2, a method of operating the memory structure 100 is illustrated. A method of operating a memory structure comprises selecting one of the memory cells by selecting corresponding one or two of the string select lines, corresponding one of the bit lines, and corresponding one of word lines. According to some embodiments, in the memory structure 100, the first conductive lines 130 are string select lines, the second conductive lines 138 are bit lines, and the conductive strips 110 are word lines. In addition, a plurality of memory cells 142 can be defined at cross points of the conductive strips 110 (word lines) and the channel layers 122. In an operation of the memory structure 100, such as programming, reading, erasing, or the like, a memory cell 142(S) to be operated is selected by selecting the corresponding string select line (the first conductive line 132(S)), the corresponding bit line (the second conductive line 138(S)), and the corresponding word line (the conductive strip 110(S)). In such a condition, the selected string select line (132(S)) is turned on, and thereby a current can pass from the bit line (138(S)) through the corresponding channel layer 122 to the underlying source line 106. In FIG. 2, the first conductive line 132(5) is the corresponding string select line. While in some other embodiments, a first conductive line 134 may be the corresponding string select line.

Referring to FIG. 3, another memory structure 200 according to embodiments is shown. The memory structure 200 is shown as a 3-D vertical channel NAND memory structure with memory cells arranged in U-type strings. Different from the memory structure 100, the stacks 108 in the memory structure 200 may be directly disposed on the buried layer 204, and the strings of the memory cells 142 are connected to a source line (not shown) by the contacts 240. As shown in FIG. 2, in the Y-direction, the channel layers 222 disposed on adjacent stacks 108 are connected to each other. In some embodiments, in the Y-direction, the memory layers 220 disposed on adjacent stacks 108 may be connected to each other.

Referring to FIG. 4, a method of operating the memory structure 200 is illustrated. Similarly, in the memory structure 200, the first conductive lines 130 may be string select lines, the second conductive lines 138 may be bit lines, and the conductive strips 110 may be word lines. In addition, a plurality of memory cells 142 can be defined at cross points of the conductive strips 110 (word lines) and the channel layers 122. In an operation of the memory structure 200, a memory cell 142(S) to be operated is selected by selecting the corresponding string select lines (the first conductive lines 132(S) and 134(S)), the corresponding bit line (138(S)), and the corresponding word line (110(5)). In such a condition, the selected string select lines (132(S) and 134(S)) are turned on, and thereby a current can pass from the bit line (138(S)) through the corresponding channel layer 122 to the corresponding contact 240 and thereby to the source line.

Now the description is directed to a method of manufacturing a memory structure according to embodiments. Such a method comprises the following steps. First, a substrate is provided. A plurality of stacks are formed on the substrate. Each of the stacks has a first side and a second side. Each of the stacks comprises a group of alternating conductive strips and insulating strips. A plurality of memory layers are formed conformally on the stacks. A plurality of channel layers are formed conformally on the memory layers. A plurality of dielectric layers are formed on at least portions of the channel layers at the first sides of the stacks and portions of the channel layers at the second sides of the stacks. A plurality of first conductive lines are formed along sidewalls of the stacks. The first conductive lines are isolated from the channel layers by the dielectric layers. The first conductive lines comprise a first group of the first conductive lines formed at the first sides of the stacks and a second group of the first conductive lines formed at the second sides of the stacks, and one first conductive line of the first group formed at the first side of one of the stacks is isolated from one first conductive line of the second group formed at the second side of the same stack and isolated from one first conductive line of the second group formed at the second side of an adjacent stack of the stacks.

Referring to FIGS. 5A-190, such a method is illustrated. Here, for ease of understanding, the method is illustrated to form the memory structure 100. The figures identified by "a" and "C" are cross-sections taken along line 1-1' and line 2-2' in the figures identified "A", respectively.

Figure 5B:
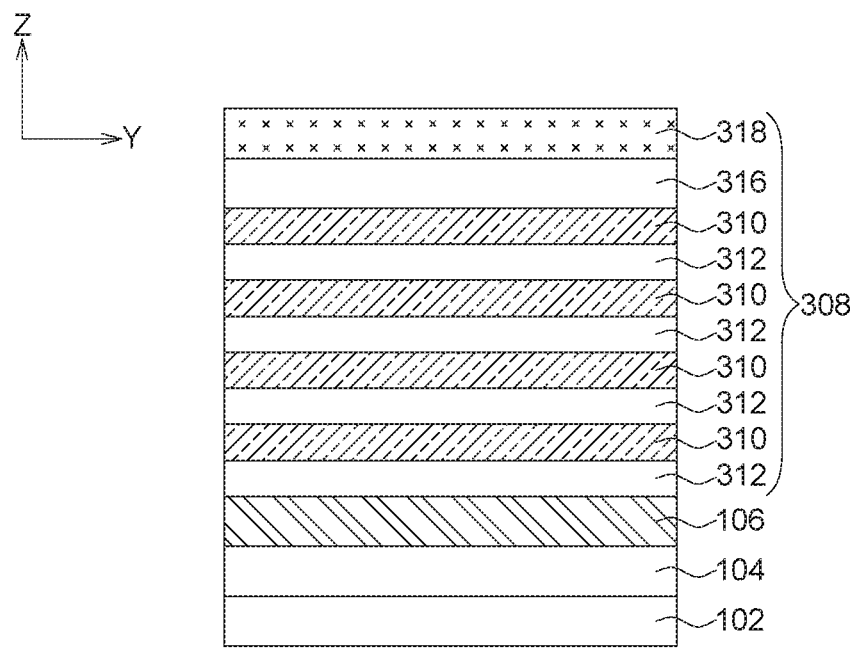

Referring to FIGS. 5A-5B, a substrate 102 is provided. The substrate 102 may comprise structures, components, and the like formed therein and/or thereon. For example, the substrate 102 may comprise a p-type well (not shown) corresponding to the positions of the stacks 108 that will be formed in the following steps. In some embodiments, as shown in FIG. 5B, a buried layer 104 is formed on the substrate 102. The buried layer 104 may be formed of oxide. A source line 106 is formed on the buried layer 104. The source line 106 may be formed of heavily-doped n-type polysilicon. An initial stack 308 for forming the stacks 108 is formed on the substrate 102. As shown in FIG. 5B, the initial stack 308 may be formed on the source line 106. The initial stack 308 comprises a group of alternating conductive layers 310 and insulating layers 312. The initial stack 308 may comprise another insulating layer 316 formed on the group of alternating conductive layers 310 and insulating layers 312. The initial stack 308 may optionally comprise an insulating layer 318 formed on the insulating layer 316. The conductive layers 310 may be formed of doped-polysilicon. The insulating layers 312 may be formed of oxide. The insulating layer 316 may be formed of oxide. The insulating layer 318 may be formed of silicon nitride (SiN). Such a SiN layer can compensate the film stress, and prevent the stack having a high aspect-ratio from collapse or bending.

Figure 6A:
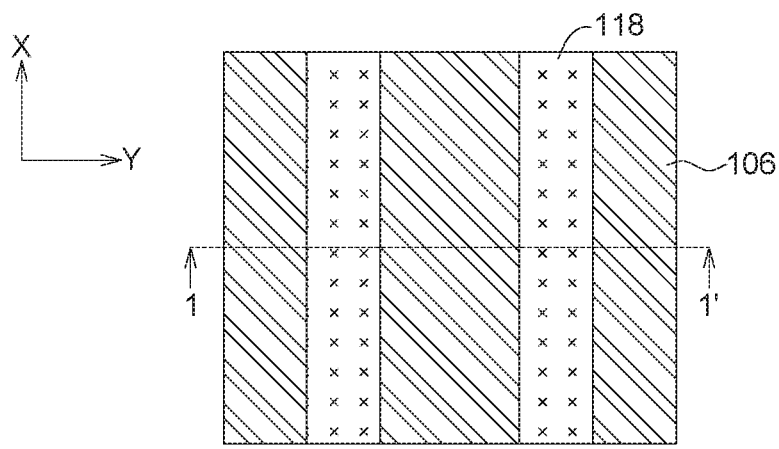
Figure 6B:
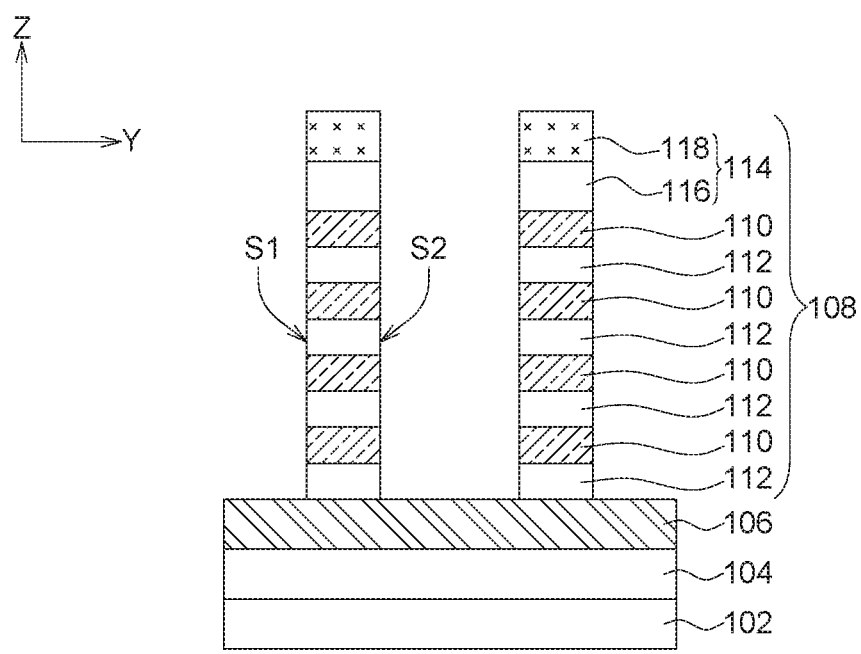

Referring to FIGS. 6A-6B, by separating the initial stack 308 using a patterning process, a plurality of stacks 108 are formed on the substrate 102. The patterning process can be stopped at the source line 106. The stacks 108 extend in a first direction, such as a X-direction. Each stack 108 has a first side S1 and a second side S2. Each stack 108 comprises a group of alternating conductive strips 110 and insulating strips 112. Each stack 108 may further comprise an upper structure 114 formed on the group of the conductive strips 110 and the insulating strips 112. The upper structure 114 may comprise a first insulating layer 116 and a second insulating layer 118. The first insulating layer 116 is formed on the group of the conductive strips 110 and the insulating strips 112. The second insulating layer 118 is formed on the first insulating layer 116.

Figure 7A:
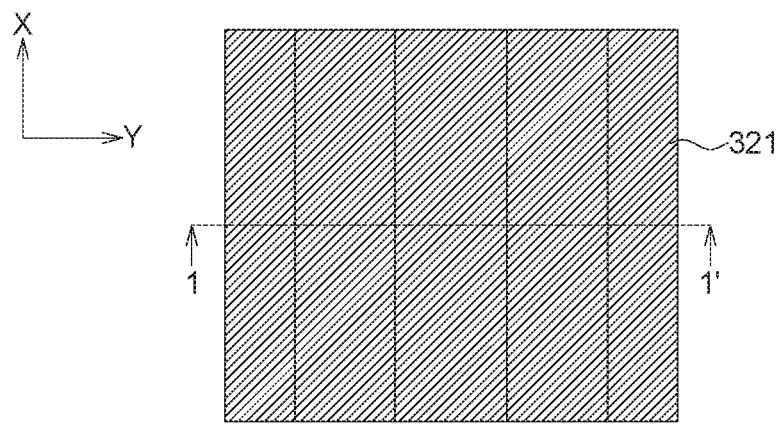
Figure 7B:
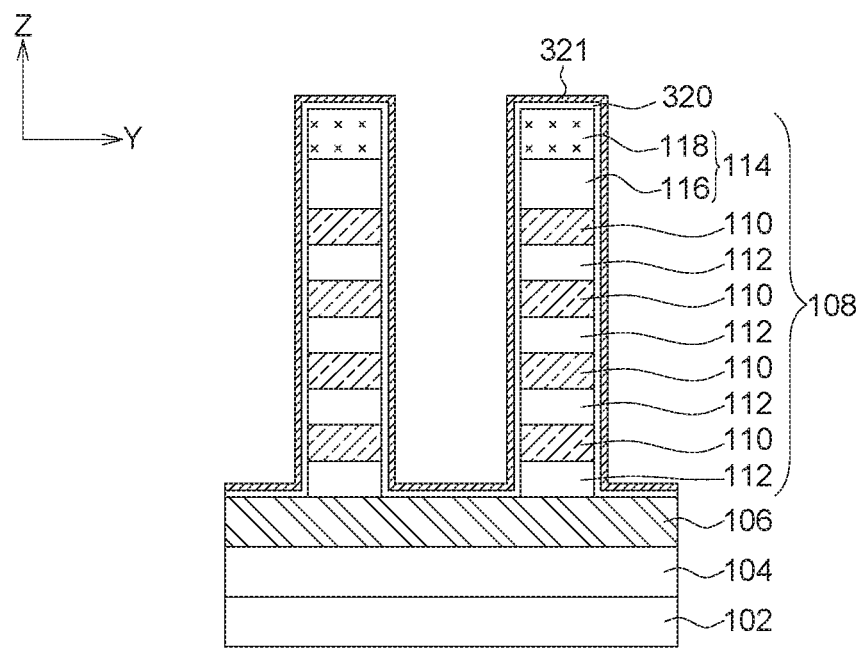

Referring to FIGS. 7A-7B, an initial memory layer 320 is formed. The initial memory layer 320 conformally covers the stacks 108. The initial memory layer 320 may have a blocking layer-trapping layer-tunneling layer structure, wherein the blocking layer is disposed closest to the stack 108, and the tunneling layer is disposed farthest away from the stack 108. The initial memory layer 320 may be formed as an ONO (oxide-nitride-oxide) multilayer structure, an ONONO (oxide-nitride-oxide-nitride-oxide) multilayer structure, an ONONONO (oxide-nitride-oxide-nitride-oxide-nitride-oxide) multilayer structure, or the like. A channel liner layer 321 is formed on the initial memory layer 320. The channel liner layer 321 conformally covers the initial memory layer 320. The channel liner layer 321 may be formed of the same material as that used for a channel layer, such as an undoped or lightly doped polysilicon material or a SiGe material.

Figure 8A:
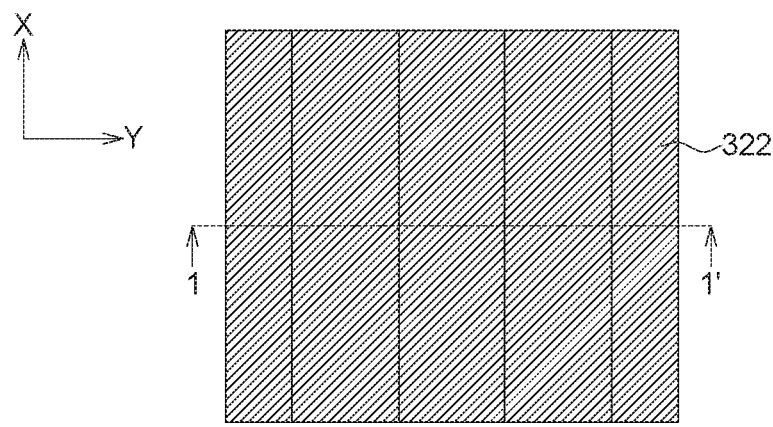
Figure 8B:
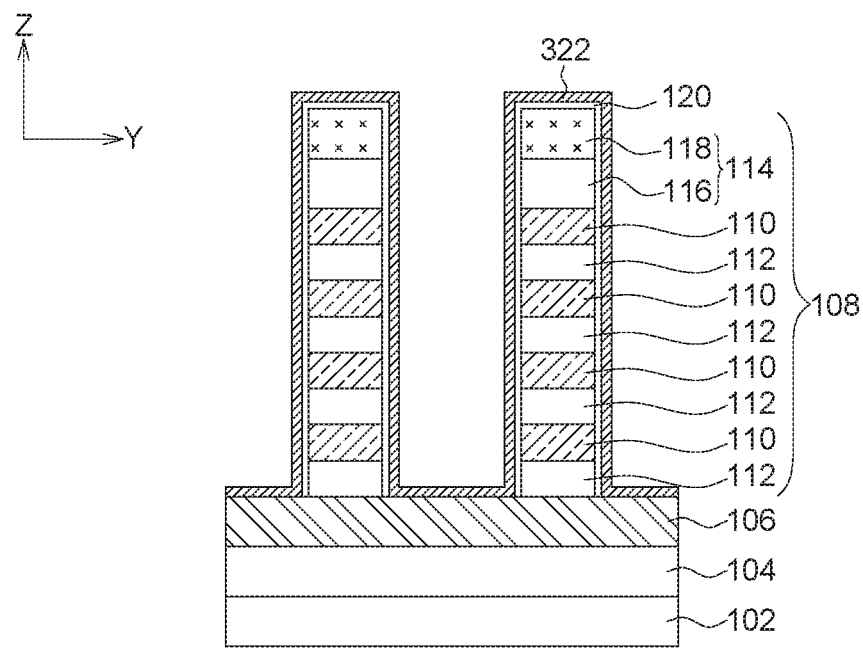

Referring to FIGS. 8A-8B, the portions of the channel liner layer 321 and the initial memory layer 320 that are formed on the exposed surfaces of the source line 106 are removed by an anisotropic etching process. As such, a plurality of memory layers 120 are formed conformally on the stacks 108. Then, a material used for a channel layer is conformally formed, such as by deposition, and thereby an initial channel layer 322 is formed. The initial channel layer 322 comprises the remaining portions of the channel liner layer 321 and the material, which is used for a channel layer, formed at this step.

Figure 9A:
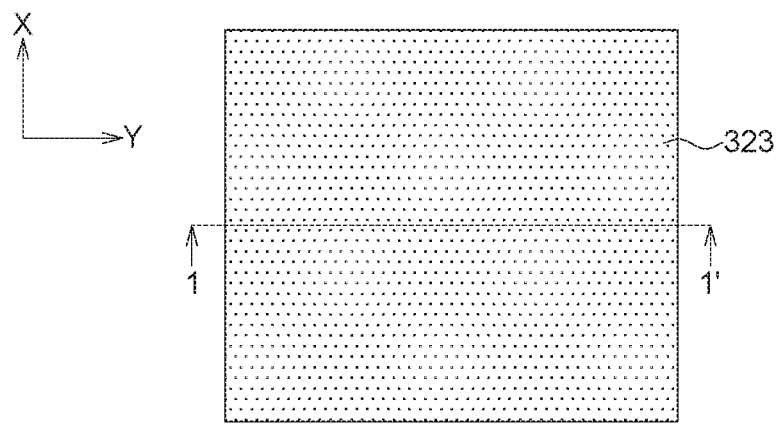
Figure 9B:
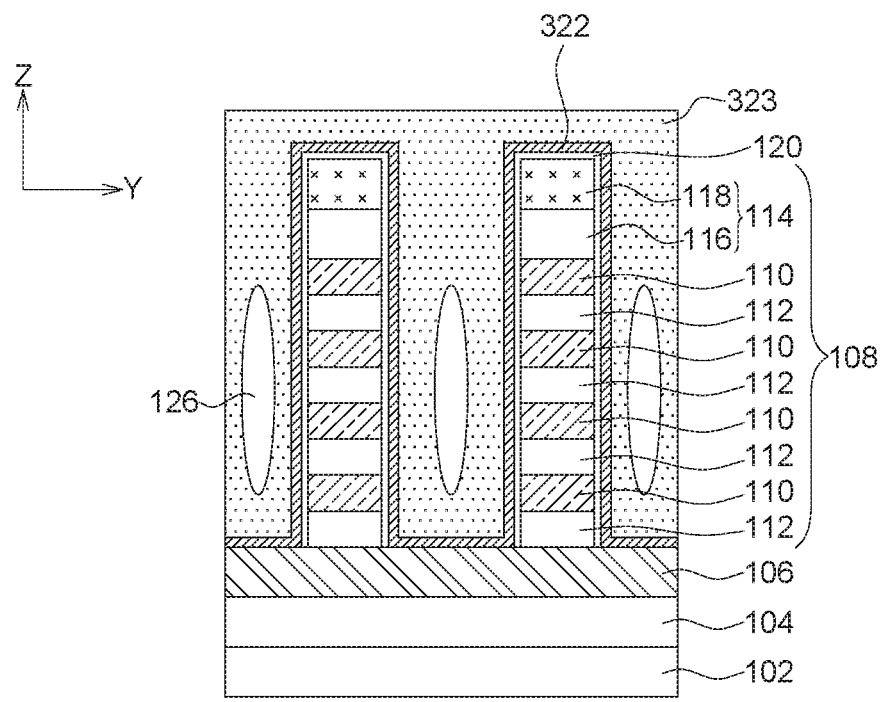

Referring to FIGS. 9A-9B, a first insulating material 323 is formed on the structure of FIGS. 8A-8B in a non-conformal manner. As such, the first insulating material 323 is filled into the spaces between the stacks 108. The first insulating material 323 may be oxide. Air gaps 126 may exist in the first insulating material 323. The air gaps 126 in the first insulating material 323 do not extend to the level of the upper structure 114.

Figure 10A:
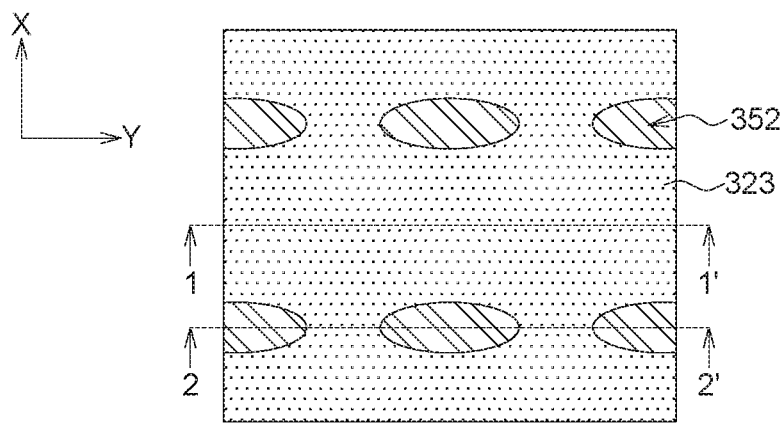
Figure 10B:
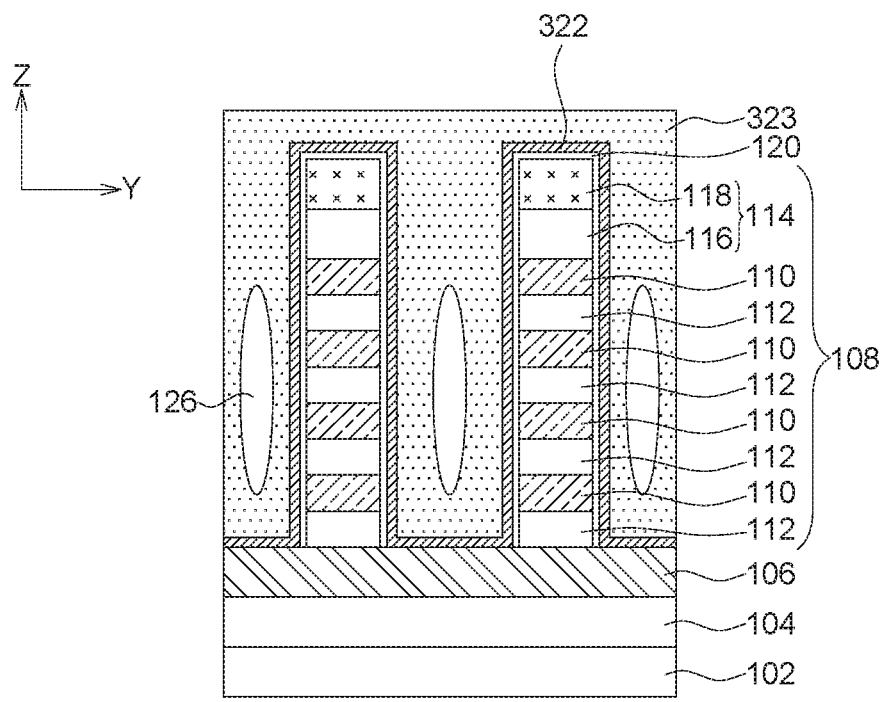
Figure 10C:
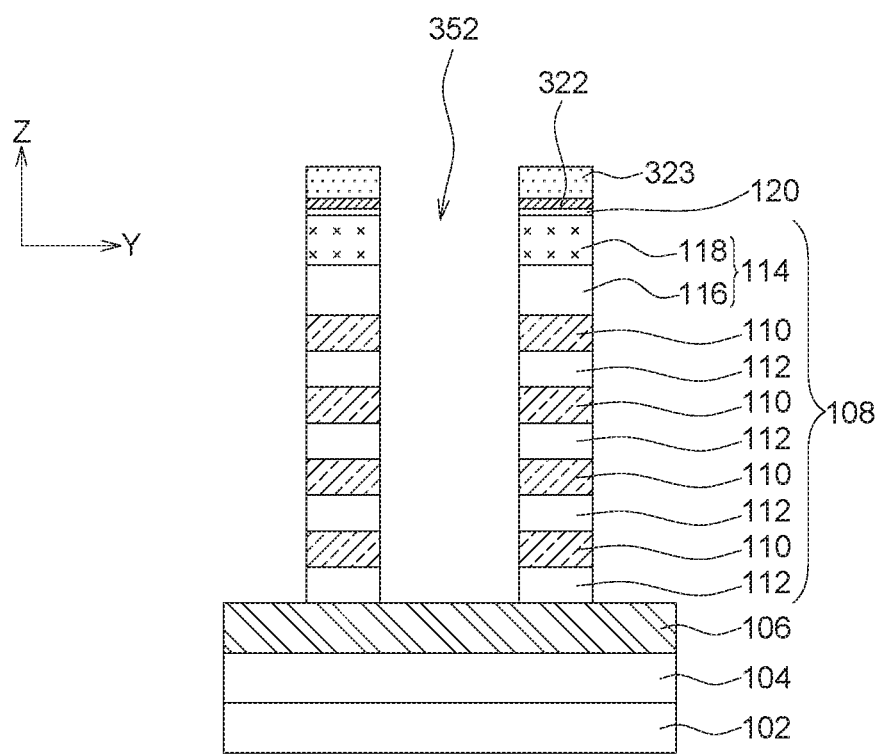

Referring to FIGS. 10A-10C, a plurality of first holes 352 are formed in the first insulating material 323, such as by etching. The oval first holes 352 are formed along a direction different from the direction in which the stacks 108 extend, such as along a Y-direction. The first holes 352 are surrounded by the first insulating material 323, and penetrate through the first insulating material 323. When forming the first holes 352, portions of the initial channel layer 322 are removed. As such, no initial channel layer 322 exists in the first holes 352. In some embodiments, as shown in FIG. 10C, portions of the memory layers 120 may also be removed. In some other embodiments, the memory layers 120 may not be removed by the formation of the first holes 352.

Figure 11A:
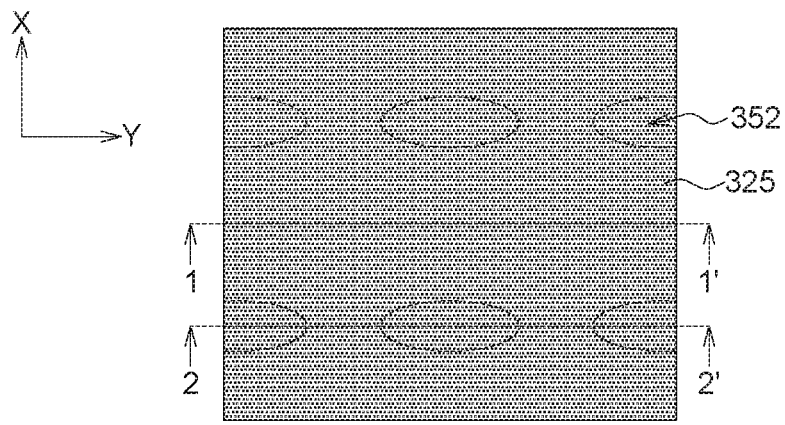
Figure 11B:
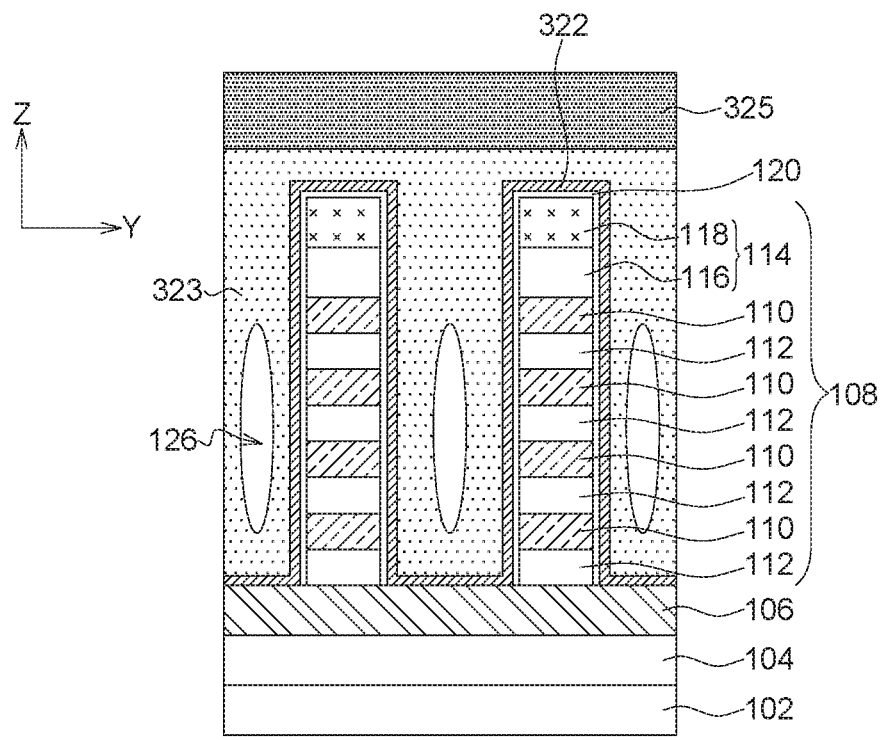
Figure 11C:
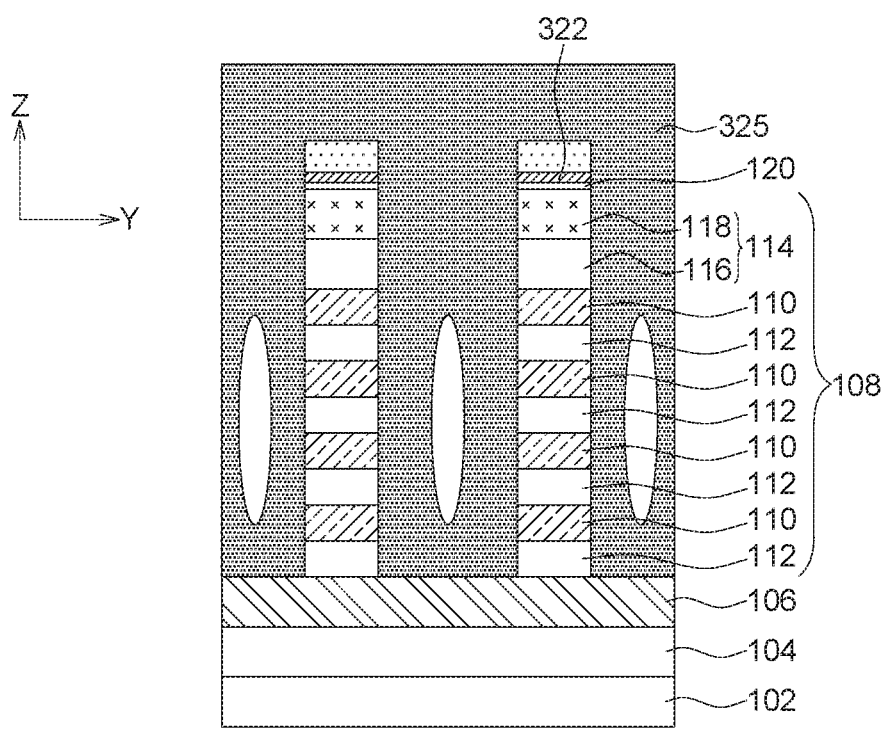

Referring to FIGS. 11A-11C, a second insulating material 325 is formed on the structure of FIGS. 10A-10C in a non-conformal manner. As such, the second insulating material 325 is filled into the first holes 352 and form sequences of oval islands arranged along the Y-direction. The second insulating material 325 may be oxide. Air gaps 126 may exist in the second insulating material 325. Similarly, the air gaps 126 in the second insulating material 325 do not extend to the level of the upper structure 114. A planarization process, such as a chemical-mechanical planarization (CMP) process, may be carried out while needed.

Figure 12A:
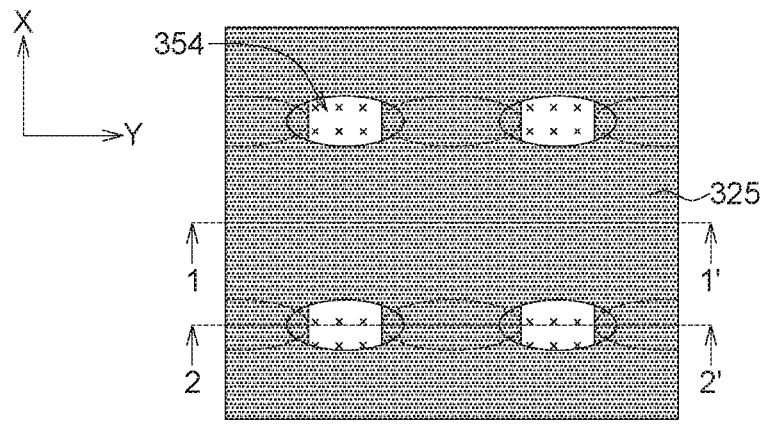
Figure 12B:
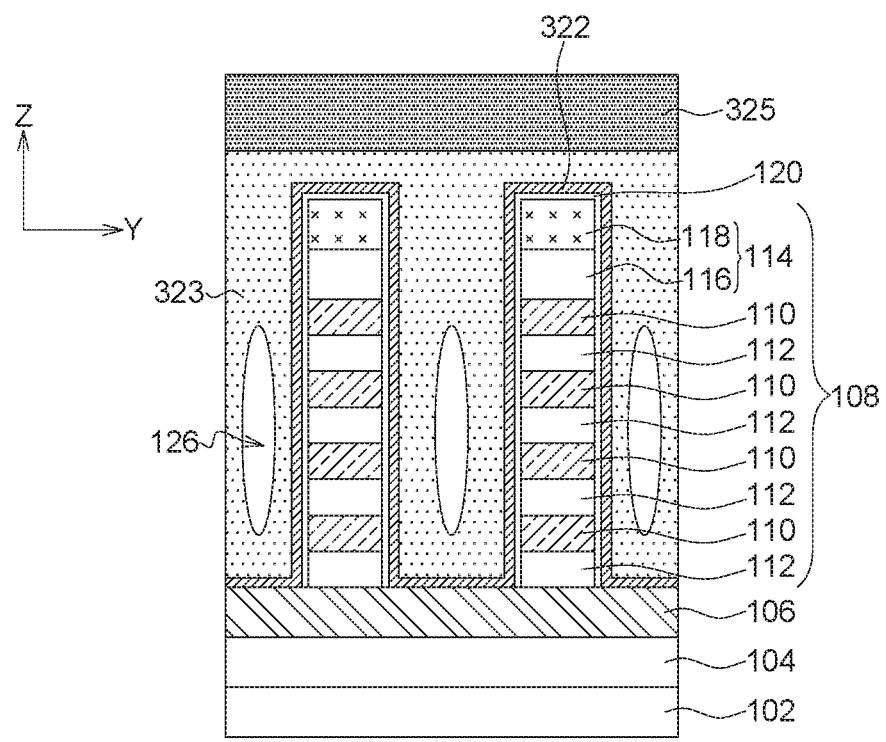
Figure 12C:
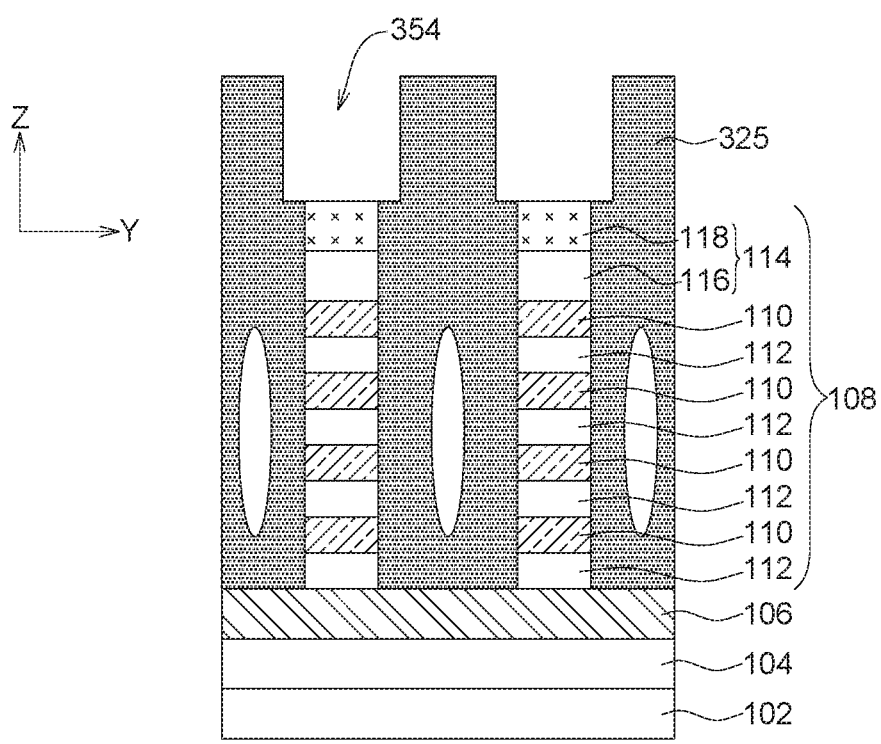
Figure 13A:
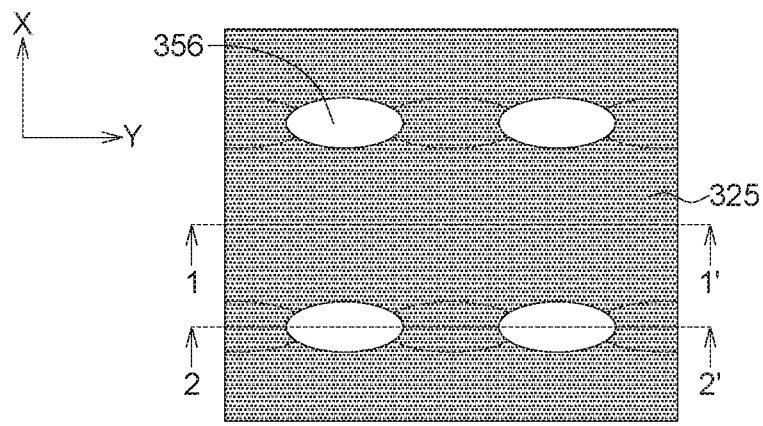
Figure 13B:
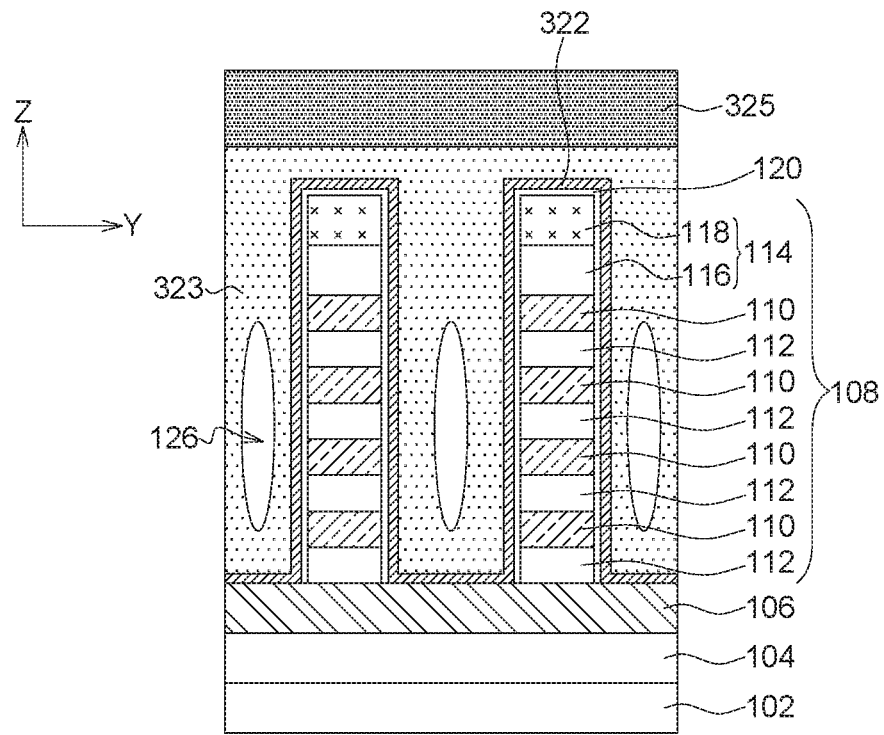
Figure 13C:
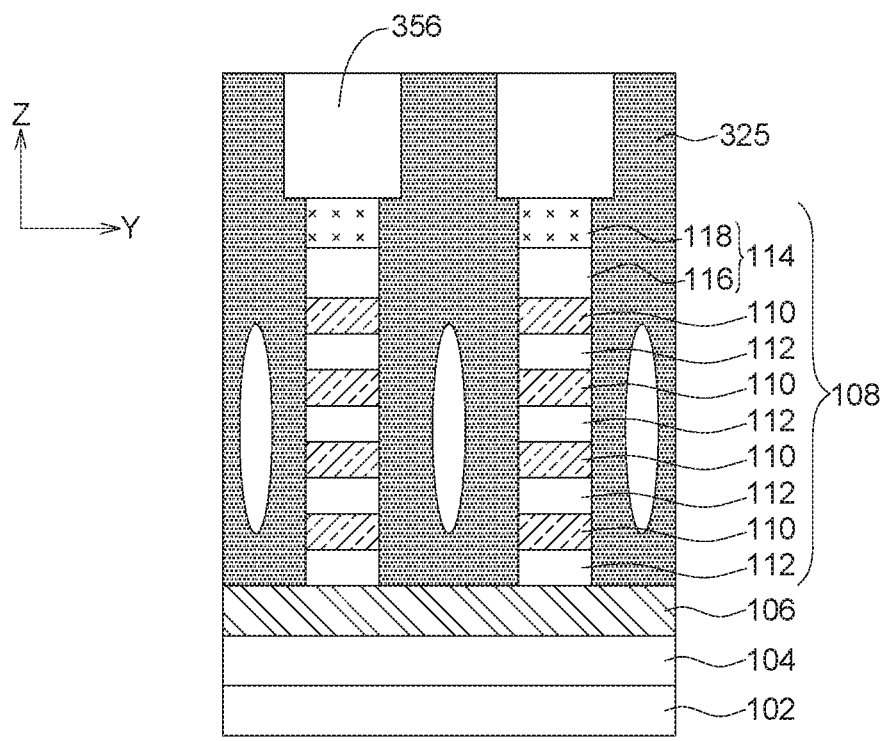

Referring to FIGS. 12A-12C, a plurality of second holes 354 are formed, such as by a photo-patterning process. Portions of the initial channel layer 322 are removed in this step at the positions corresponding to the portions removed by the formation of the first holes 352. As such, the initial channel layer 322 is separated in the extending direction of the stacks 108 (the X-direction), and thereby a plurality of channel layers 122 conformally positioned on the memory layers 120 are formed. Then, as shown in FIGS. 13A-13C, a third insulating material 356 is filled into the second holes 354. The third insulating material 356 may be silicon nitride (SiN) or oxide. A planarization process, such as a CMP process, may be carried out while needed.

Figure 14A:
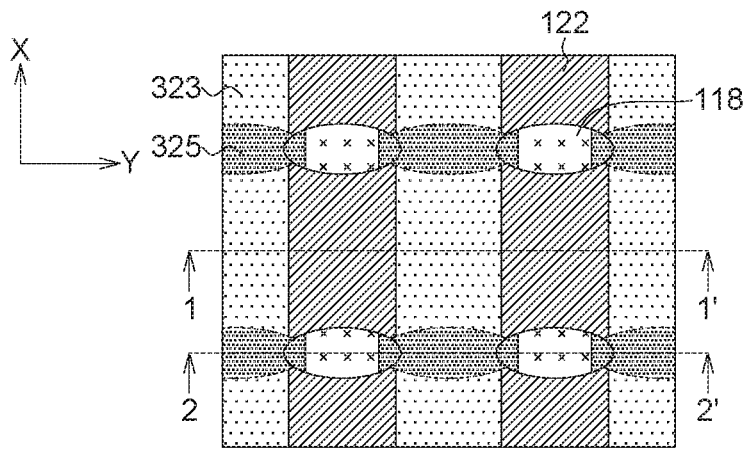
Figure 14B:
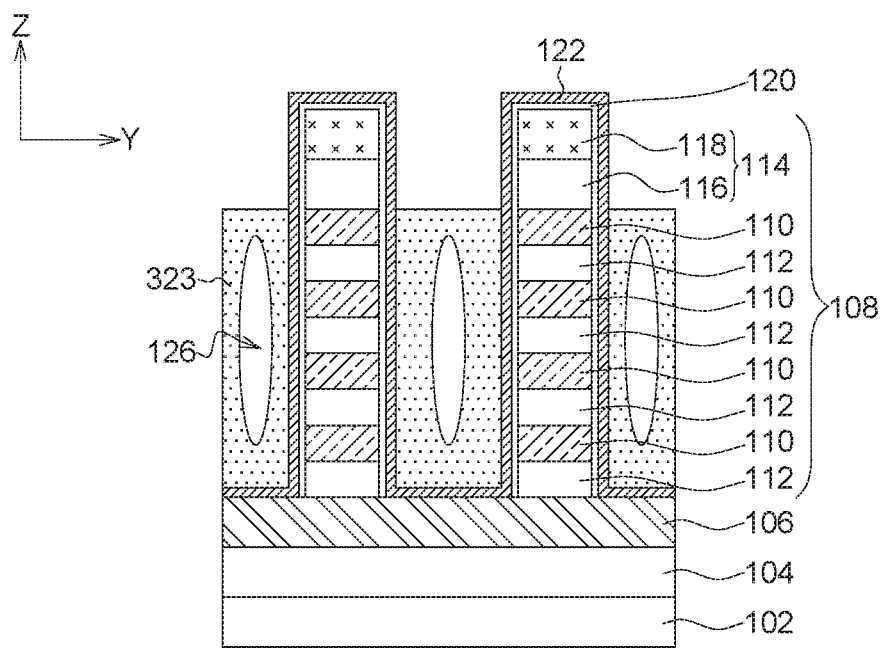
Figure 14C:
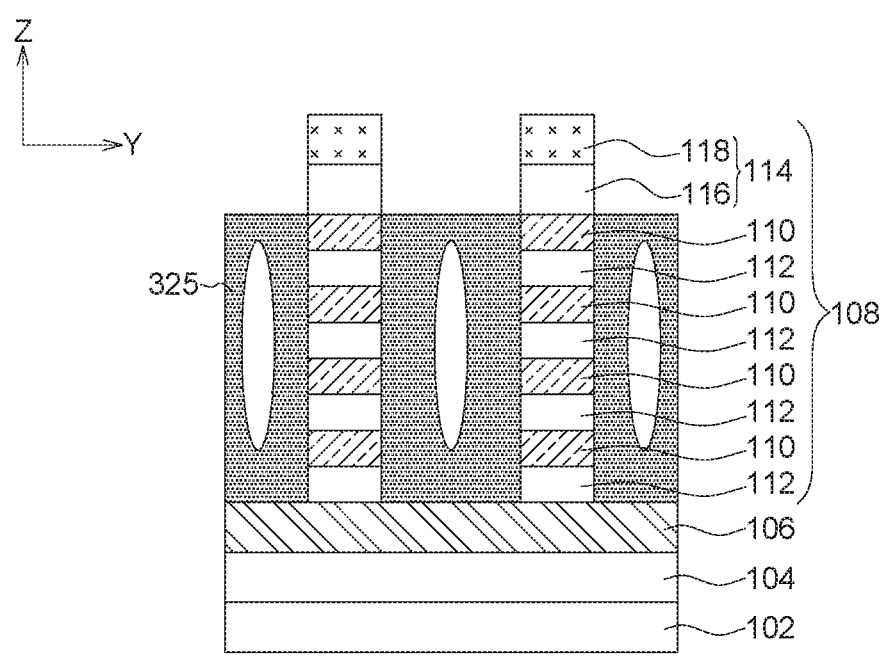

Referring to FIGS. 14A-14C, a selectively removing process, such as an etching process with high selectivity for polysilicon or the material of the channel layer, is carried out. By this step, both the first insulating material 323 and the second insulating material 325 remain only between the stacks 108. The first insulating material 323 and the second insulating material 325 are adjacent to each other in the extending direction of the stacks 108 (the X-direction). The combination of the remaining portions of the first insulating material 323 and the second insulating material 325 is equivalent to the insulating material 124 in FIG. 1, which is formed between the stacks 108 corresponding to the groups of the conductive strips 110 and the insulating strips 112. The air gaps 126 do not exposed by this step.

Figure 15A:
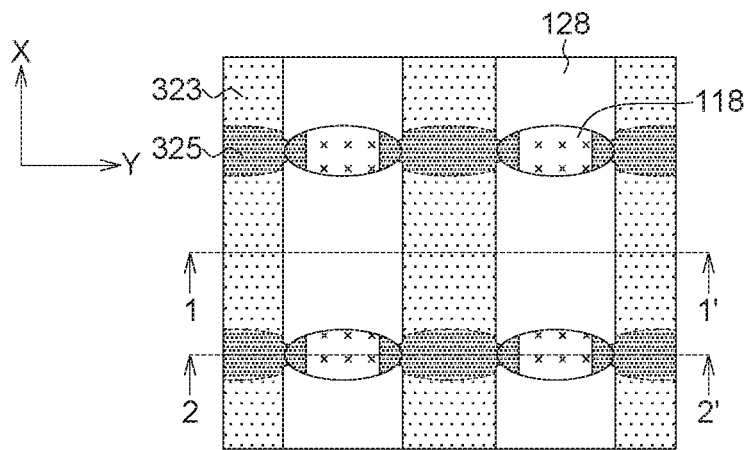
Figure 15B:
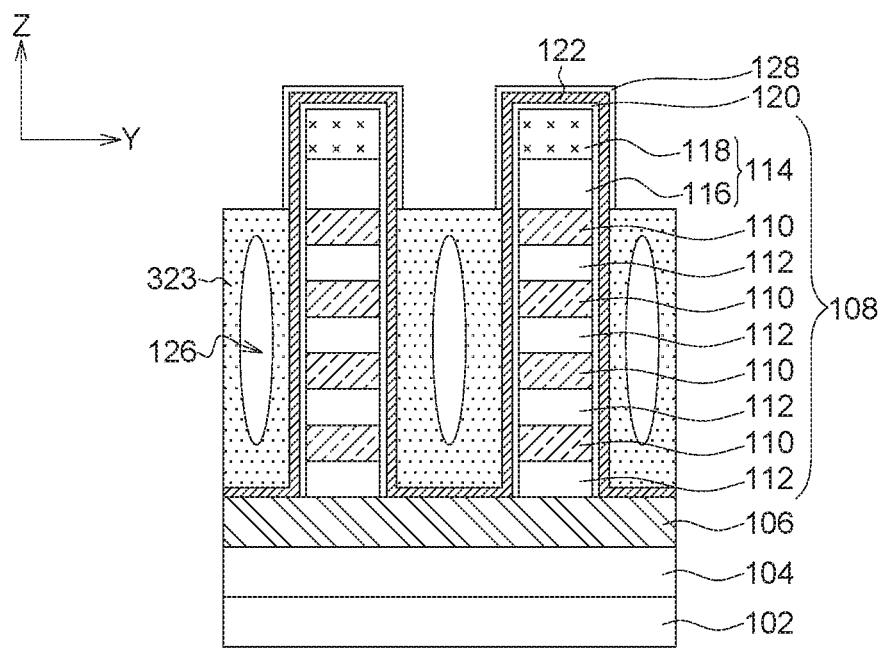
Figure 15C:
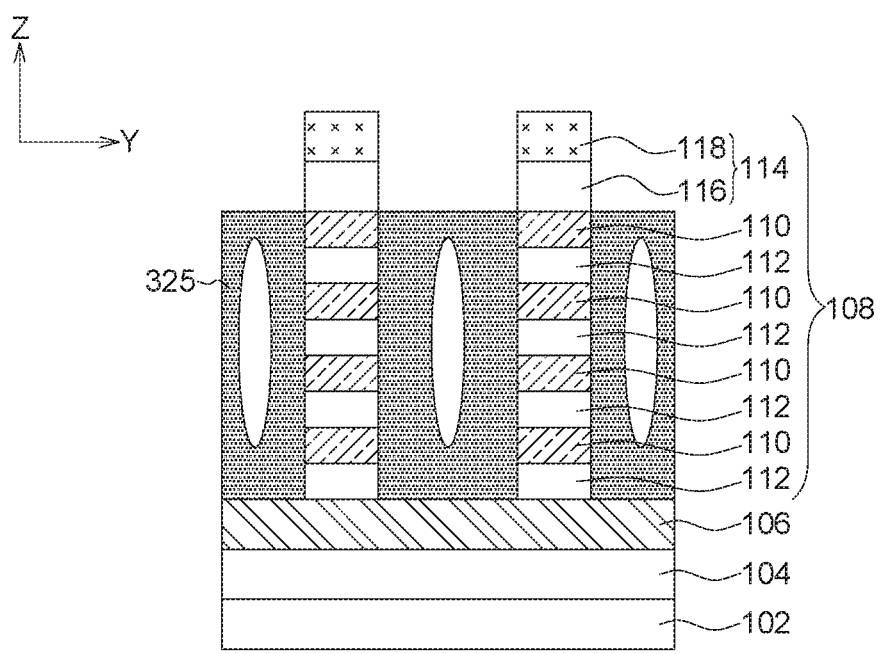

Referring to FIGS. 15A-15O, a plurality of dielectric layers 128 are formed on at least portions of the channel layers 122 at the first sides S1 of the stacks 108 and portions of the channel layers 122 at the second sides S2 of the stacks 108. For example, the dielectric layers 128 may comprise an oxide material and be formed by oxidizing the exposed portions of the channel layers 122 or depositing the oxide material onto these portions. As such, the formed dielectric layers 128 at the level higher than the first insulating material 323 and the second insulating material 325. In some embodiments, the dielectric layers 128 formed by oxidation may be about 70 Å thick. In some embodiments, instead of the oxide material, dielectric layers 128 may comprise a high-k dielectric material.

Figure 16A:
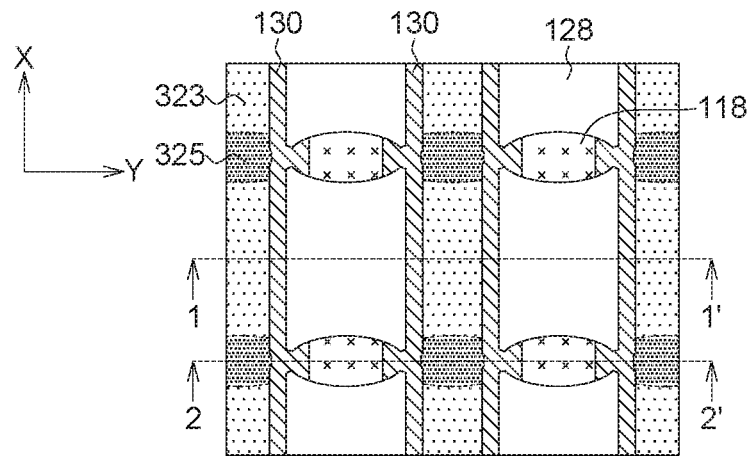
Figure 16B:
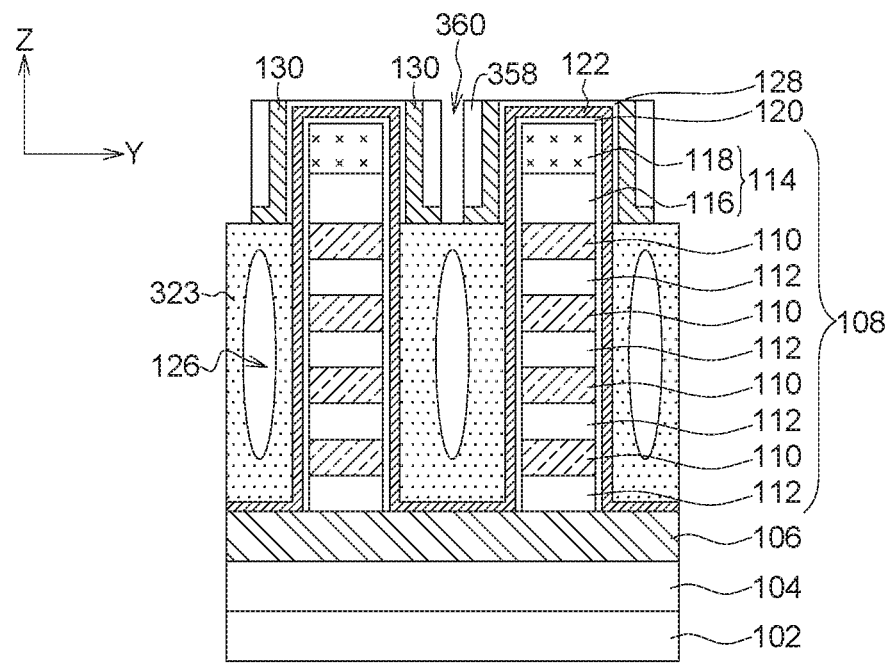
Figure 16C:
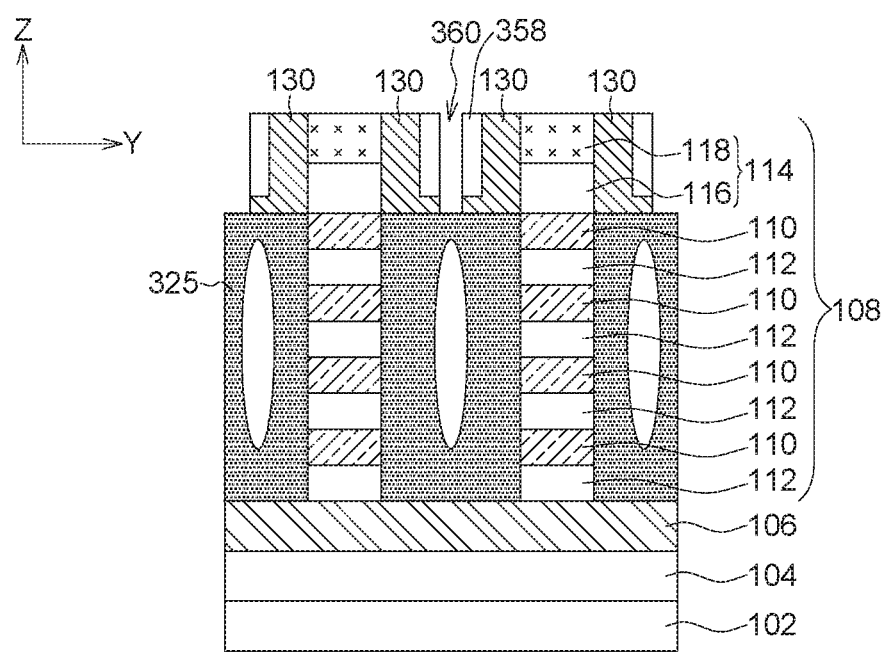

Referring to FIGS. 16A-16O, a plurality of first conductive lines 130 are formed along sidewalls of the stacks 108. For example, a conductive material for forming the first conductive lines 130 may be formed on the channel layers 122 exposed by the first insulating material 323 and the second insulating material 325, such as in a conformal manner. An insulating material 358 (not shown in FIG. 16A) may be filled into the remaining spaces. Then, cutting paths 360 are formed between the stacks 108, such as by an etching process. As such, the conductive material between the stacks 108 is separated, and thereby the first conductive lines 130 are formed. Such a process is a self-aligned process. The first conductive lines 130 formed by these steps are positioned above the first insulating material 323 and the second insulating material 325. The first conductive lines 130 are isolated from the channel layers 122 by the dielectric layers 128. As shown in FIG. 1, the first conductive lines 130 comprise a first group of the first conductive lines (132) formed at the first sides S1 of the stacks 108 and a second group of the first conductive lines (134) formed at the second sides S2 of the stacks 108, and one first conductive line 132 of the first group formed at the first side S1 of one stack 108 is isolated from one first conductive line 134 of the second group formed at the second side S2 of the same stack 108 and isolated from one first conductive line 134 of the second group formed at the second side S2 of an adjacent stack 108. A cutting process may be carried out to separate the first conductive line 132 and the first conductive line 134 corresponding to the same stack 108 at the end portions of the stack 108 while needed.

Figure 17A:
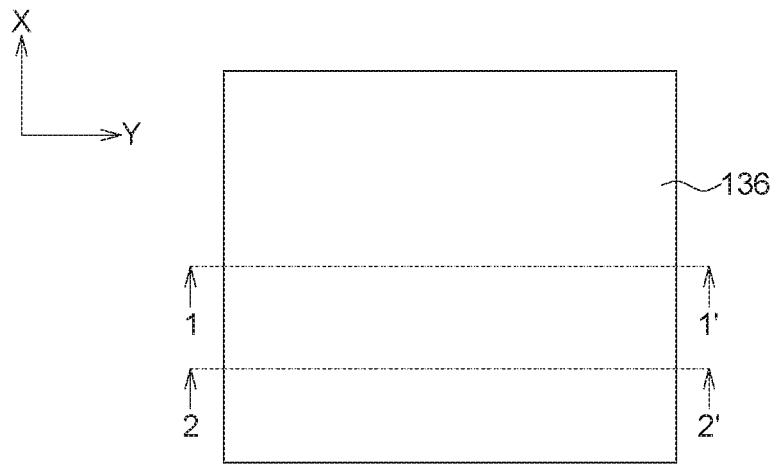
Figure 17B:
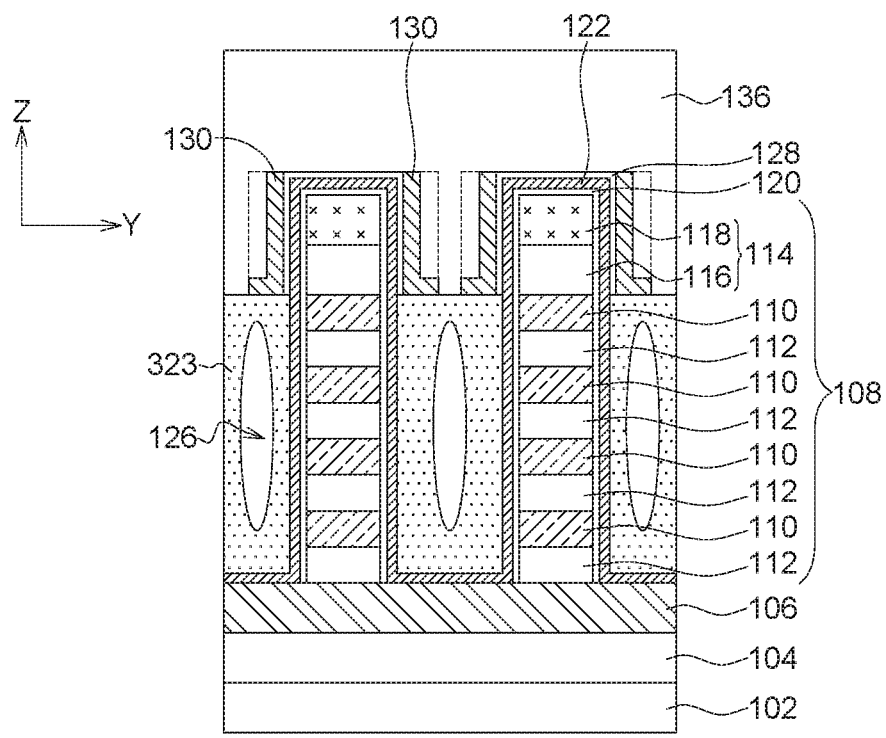
Figure 17C:
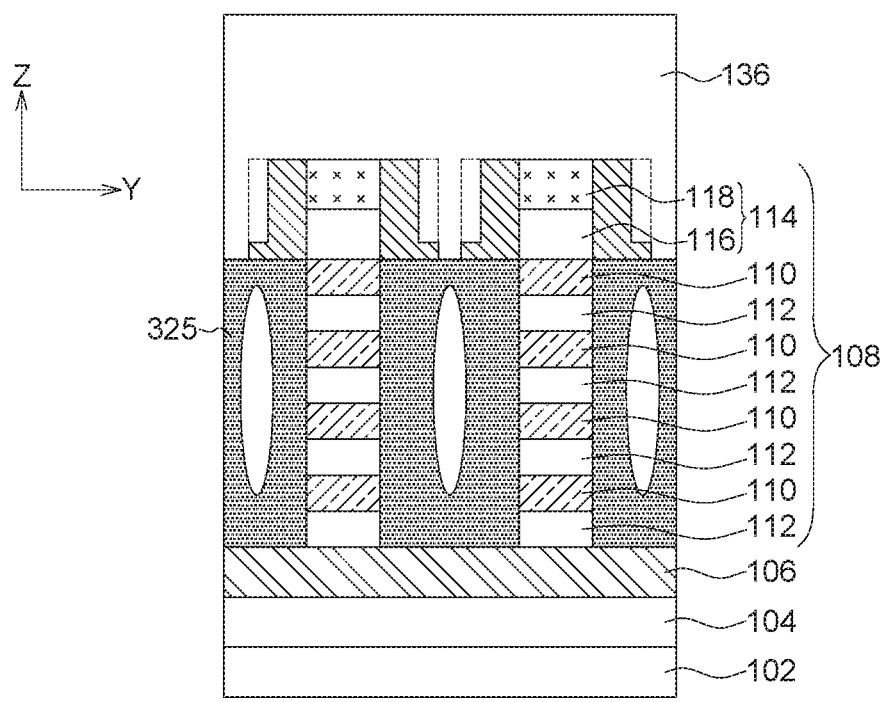

Referring to FIGS. 17A-17O, an interlayer dielectric material 136 is formed on the structure of FIGS. 16A-16O, such as by deposition. The interlayer dielectric material 136 may be oxide. In some embodiments, the interlayer dielectric material 136 is the same as the insulating material 358. A planarization process, such as a CMP process, may be carried out while needed.

Figure 18A:
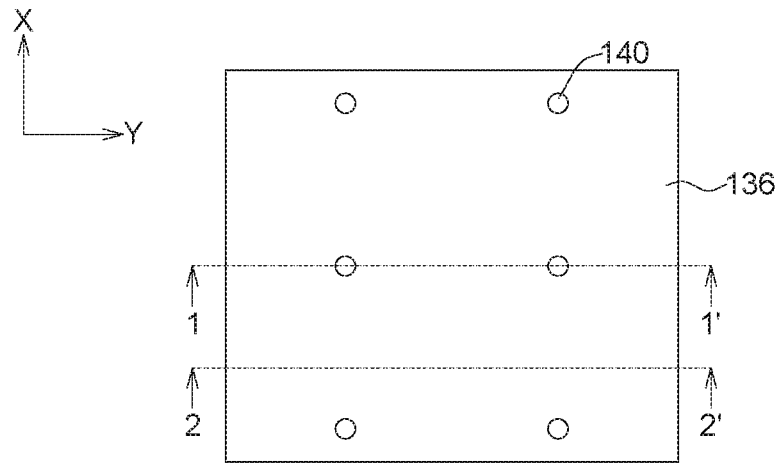
Figure 18B:
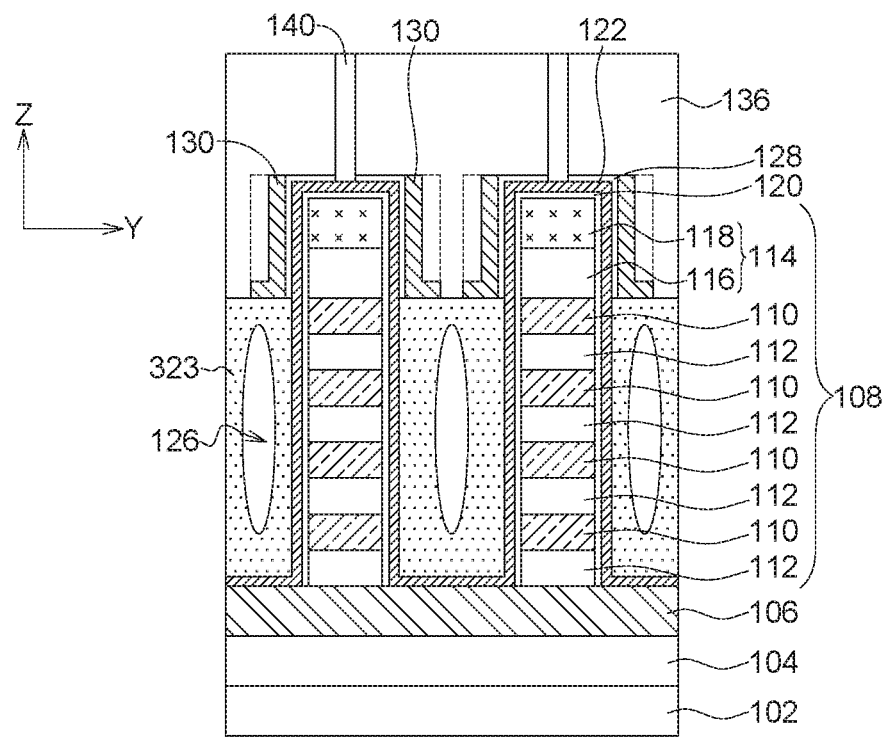
Figure 18C:
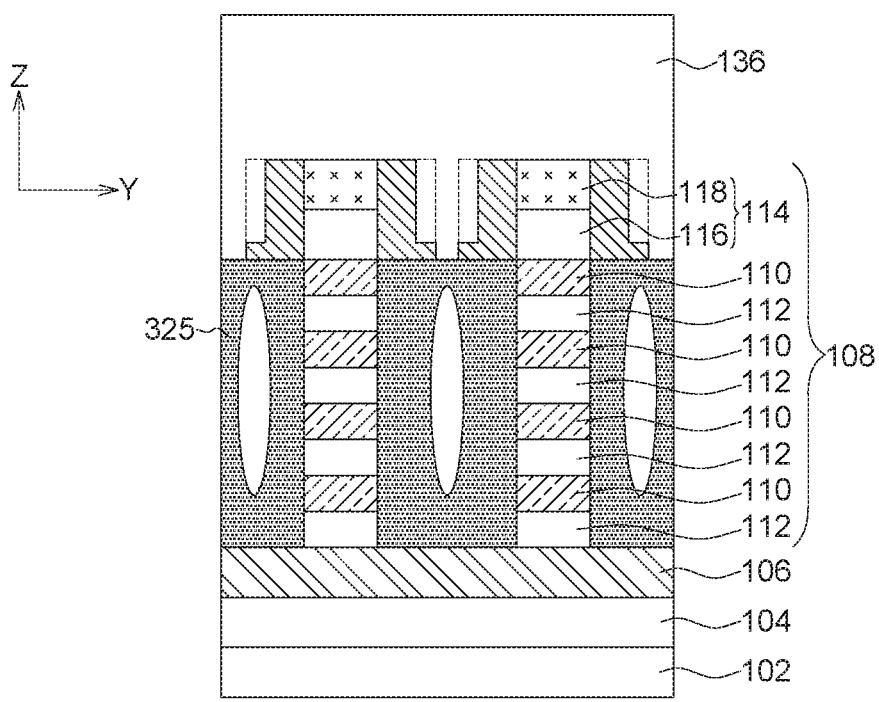

Referring to FIGS. 18A-18O, a plurality of contacts 140 are formed through the interlayer dielectric material 136, such as by a photo-patterning process like an etching process. The contacts 140 are used to connect the second conductive lines 138, which will be formed in the following steps, to the channel layers 122. In some embodiments, contacts (not shown) for the first conductive line 134 are formed at the end portions of the stack 108, such as by the same process for the formation of the contacts 140.

Figure 19A:
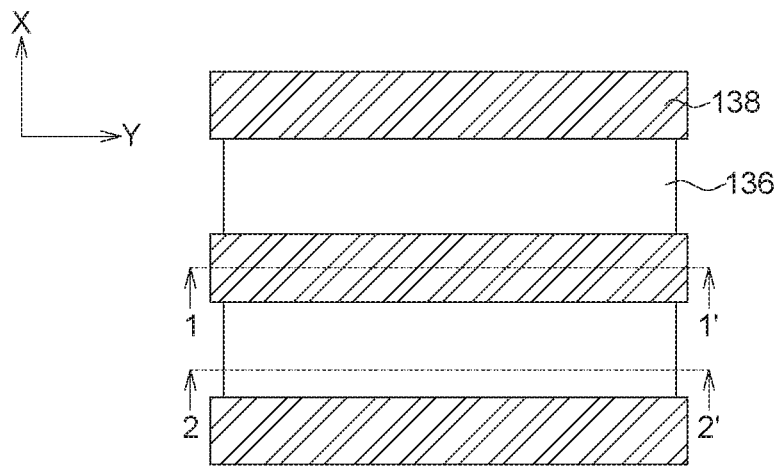
Figure 19B:
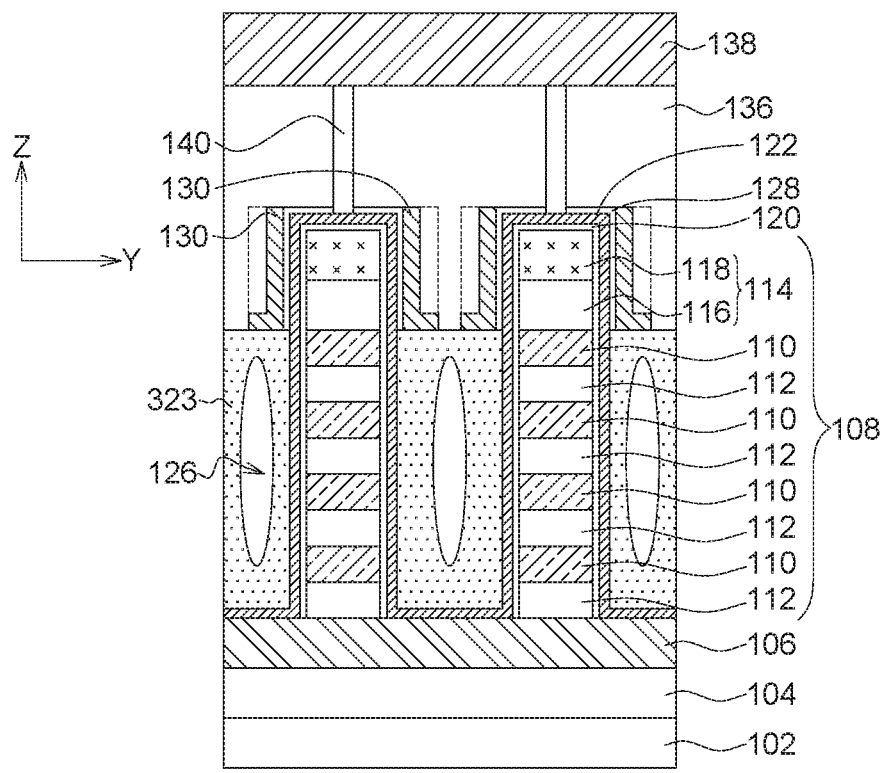
Figure 19C:
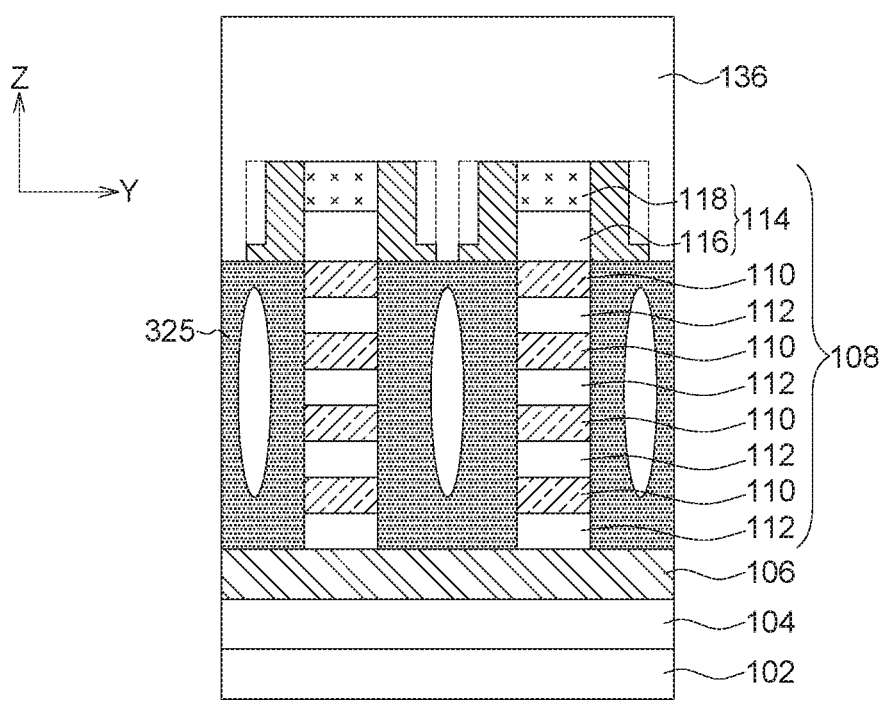

Referring to FIGS. 19A-19O, a plurality of second conductive lines 138 are formed over the first conductive lines 130. As shown in FIG. 19B, the second conductive lines 138 may be formed on the interlayer dielectric material 136 and connected to the channel layers 122 by the contacts 140. The second conductive lines 138 extend in a second direction different from the first direction, such as the Y-direction.

The memory structure according to the embodiments has a configuration in which two string select lines (132 and 134) corresponding to one stack of word lines (108). As such, a channel layer (122) can be divided into two parts controlled by the two string select lines, respectively. Thereby, a physical two-bits structure can be provided. By such a configuration, the density of the bit lines (138) can be decreased to half of that in a conventional memory structure. In addition, since the string select lines (130) are not formed in the stacks (108), they can be formed of a metal material with gate dielectric layers (128) formed of a high-k dielectric material. Thereby, the resistance of the string select lines can be reduced, and the controllability thereof can be improved.

It can be understood that, while the forgoing embodiments are directed to the 3-D vertical channel NAND memory structures with memory cells arranged in I-type and U-type strings, the provided configuration in which two string select lines corresponding to one stack and the methods of operating and manufacturing the same can be applied to other types of memory structures while possible.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
   a substrate;
   a plurality of stacks disposed on the substrate, wherein each of the stacks has a first side and a second side, and each of the stacks comprises a group of alternating conductive strips and insulating strips;
   a plurality of memory layers conformally disposed on the stacks;
   a plurality of channel layers conformally disposed on the memory layers;
   a plurality of dielectric layers disposed on at least portions of the channel layers at the first sides of the stacks and portions of the channel layers at the second sides of the stacks; and
   a plurality of first conductive lines disposed along sidewalls of the stacks, wherein the first conductive lines are isolated from the channel layers by the dielectric layers;
   wherein the first conductive lines comprise a first group of the first conductive lines disposed at the first sides of the stacks and a second group of the first conductive lines disposed at the second sides of the stacks, and one first conductive line of the first group disposed at the first side of one of the stacks is isolated from one first conductive line of the second group disposed at the second side of the same stack and isolated from one first conductive line of the second group disposed at the second side of an adjacent stack of the stacks.

2. The memory structure according to claim 1, wherein each of the stacks further comprises an upper structure disposed on the group of the conductive strips and the insulating strips, and the upper structure comprises:
   a first insulating layer disposed on the group of the conductive strips and the insulating strips; and
   a second insulating layer disposed on the first insulating layer.

3. The memory structure according to claim 2, wherein the portions of the channel layers at the first sides of the stacks and the portions of the channel layers at the second sides of the stacks correspond to the upper structures of the stacks.

4. The memory structure according to claim 1, wherein the dielectric layers comprise at least one of: an oxide material, and a high-k dielectric material.

5. The memory structure according to claim 1, wherein the first conductive lines comprise at least one of: a polysilicon-based material, and a metal material.

6. The memory structure according to claim 1, wherein the first conductive lines have L-shaped cross sections.

7. The memory structure according to claim 6, wherein the L-shaped cross sections of the first group of the first conductive lines and the L-shaped cross sections of the second group of the first conductive lines are mirror symmetrically.

8. The memory structure according to claim 1, further comprising:
   an insulating material disposed between the stacks corresponding to the groups of the conductive strips and the insulating strips;
   wherein the dielectric layers and the first conductive lines are positioned above the insulating material.

9. The memory structure according to claim 1, wherein the first conductive lines are disposed at a level higher than the groups of the conductive strips and the insulating strips.

10. The memory structure according to claim 1, wherein the first conductive lines are string select lines.

11. The memory structure according to claim 1, wherein more than one of the channel layers are disposed on each of the stacks.

12. The memory structure according to claim 1, further comprising:
    a plurality of second conductive lines disposed over the first conductive lines;
    wherein the conductive strips of the stacks extend in a first direction, the first conductive lines substantially extend in the first direction, and the second conductive lines extend in a second direction different from the first direction.

13. The memory structure according to claim 12, wherein the first conductive lines are string select lines, the second conductive lines are bit lines, and the conductive strips are word lines.

14. The memory structure according to claim 13, wherein a plurality of memory cells are defined at cross points of the conductive strips and the channel layers.

15. A method of operating the memory structure according to claim 14, comprising:
    selecting one of the memory cells by selecting corresponding one or two of the string select lines, corresponding one of the bit lines, and corresponding one of word lines.

16. A method of manufacturing a memory structure, comprising:
    providing a substrate;
    forming a plurality of stacks on the substrate, wherein each of the stacks has a first side and a second side, and each of the stacks comprises a group of alternating conductive strips and insulating strips;
    forming a plurality of memory layers conformally on the stacks;
    forming a plurality of channel layers conformally on the memory layers;
    forming a plurality of dielectric layers on at least portions of the channel layers at the first sides of the stacks and portions of the channel layers at the second sides of the stacks; and
    forming a plurality of first conductive lines along sidewalls of the stacks, wherein the first conductive lines are isolated from the channel layers by the dielectric layers;
    wherein the first conductive lines comprise a first group of the first conductive lines formed at the first sides of the stacks and a second group of the first conductive lines formed at the second sides of the stacks, and one first conductive line of the first group formed at the first side of one of the stacks is isolated from one first conductive line of the second group formed at the second side of the same stack and isolated from one first conductive line of the second group formed at the second side of an adjacent stack of the stacks.

17. The method according to claim 16, wherein forming the plurality of channel layers comprises:
   forming an initial channel layer; and
   separating the initial channel layer in an extending direction of the stacks.

18. The method according to claim 16, wherein each of the stacks further comprises an upper structure formed on the group of the conductive strips and the insulating strips, and the method further comprises:
   forming an insulating material between the stacks corresponding to the groups of the conductive strips and the insulating strips;
   wherein the dielectric layers and the first conductive lines are positioned above the insulating material.

19. The method according to claim 18, wherein forming the first conductive lines comprises:
   forming a conductive material on the channel layers exposed by the insulating material; and
   separating the conductive material between the stacks.

20. The method according to claim 16, further comprising:
   forming a plurality of second conductive lines over the first conductive lines;
   wherein the conductive strips of the stacks extend in a first direction, the first conductive lines substantially extend in the first direction, and the second conductive lines extend in a second direction different from the first direction.

* * * * *